July 7, 1964 W. T. WAKELY 3,140,343
HEADER MOUNT FOR SEMICONDUCTOR DEVICE
Filed Oct. 24, 1961
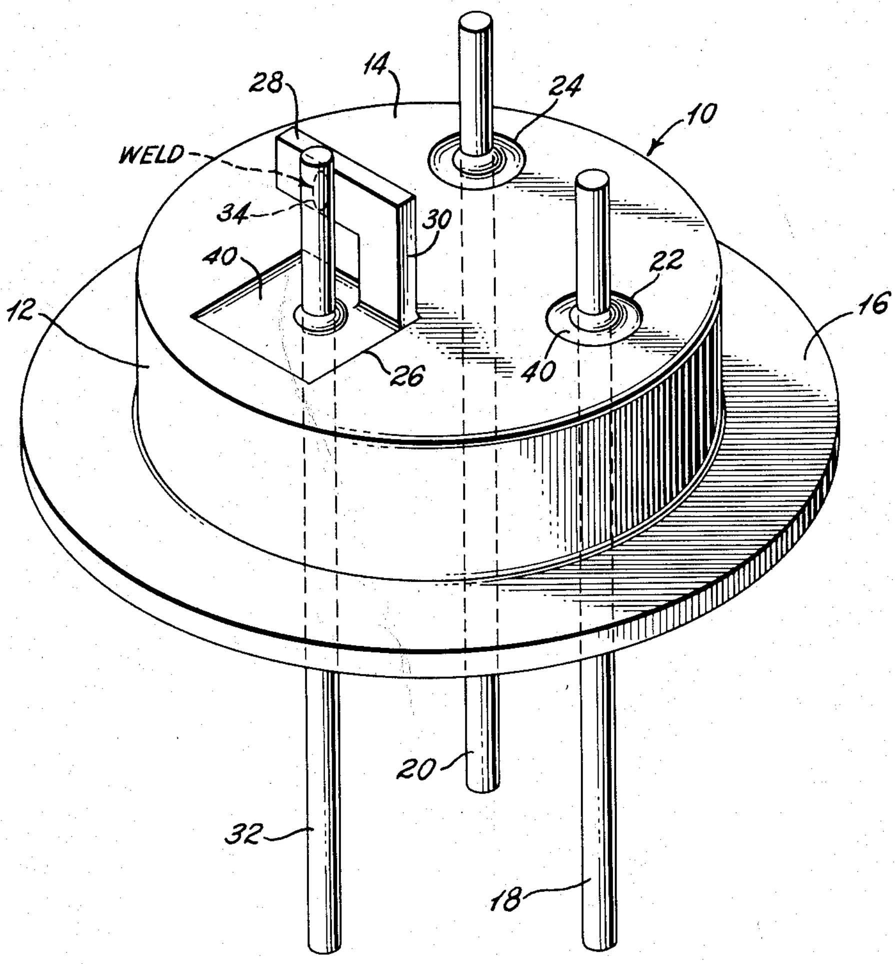
INVENTOR
Wilbur T. Wakely
BY
Stevens, Davis, Miller & Mosher
ATTORNEYS 3,140,343

HEADER MOUNT FOR SEMICONDUCTOR DEVICE

Wilbur T. Wakely, Dallas, Tex., assignor to Texas Instruments Incorporated, Dallas, Tex., a corporation of Delaware Filed Oct. 24, 1961, Ser. No. 147,309
2 Claims. (Cl. 174—50.56)

The present invention relates to an improved header design for mounting semiconductor devices.

In the art of fabricating semiconductor devices, it is accepted practice to mount the semiconductor element, with contacts attached, onto a support structure known as a header. The header is in the form of a metallic cup defining two to four apertures through which project wire leads. A fused glass bead fills the header and maintains the leads isolated therefrom. Frequently, the semiconductor element is mounted directly onto the header and the leads are attached by wires to appropriate contacts on the element. Since the element is directly attached to the header, one of the leads makes electrical contact with the header.

At present there are several ways to contact a lead electrically with the header, all of which are characterized by one or more drawbacks. For instance, in one way the lead is welded to the header prior to fusing the glass bead. The drawbacks to this way are that precision equipment is required to maintain close tolerances on lead position and that angularity, and mechanized loading of the final header assembly is not practical, manual handling being necessary to prevent bending of the welded lead.

In another way, a lead is bent and welded to the header after fusing the glass bead. This way has its drawbacks in that bending fractures the glass miniscus surrounding the lead leaving etch traps, the welding heat fractures the glass-to-metal seal and bending and welding are extra steps both requiring special equipment.

A further way is to stake the lead to the header. This also is done after fusing the glass bead. The lead to be staked is fused as a through lead (passes through an aperture in the header) and terminates in a nail head configuration which is upset to bring it into intimate contact with the surface of the header. This way has the same drawbacks as bending and welding a lead except that there are no noticeable heat effects resulting from staking.

A still further way involves fusing the lead as a through lead and welding it to a tab punched and bent up from the header surface. The major drawback of this technique is that during fusing of the glass bead, glass flows by capillary attraction up the narrow space defined between the lead and the tab and prevents welding of the lead to the tab.

As is evident, a variety of ways are available in the art to attach a lead to a header, all of which suffer disadvantages. Hence, this step in the fabrication of a semiconductor device, though seemingly inconsequential and of little moment, has taken on significant importance from a cost as well as a reliability standpoint in view of the difficulty encountered in carrying out this step. It was to relieve this troubled area of semiconductor fabrication that this invention was conceived.

By means of the present invention the capillary problem inherent in the bent tab technique previously discussed is solved, sub-assembly welding and special handling are eliminated, and mechanized load and inverted loading—permitting fusing leads to final length—are made possible. All of these features are accomplished by the present invention through the use of a horizontal member of unique configuration punched and bent up from the surface of the header. The horizontal member is elevated from the surface of the header by a vertical portion and therefore the possibility of a glass flow between the horizontal member and lead due to capillary attraction during fusing of the glass bead is non-existent.

Accordingly, it is an object of this invention to provide an improved header design wherein one lead is electrically attached to the header in a manner superior to prior known techniques for attaching a lead to the header.

It is a further object of this invention to provide a unique header structure characterized by an elevated horizontal member whereby a lead can be electrically attached to the header more expeditiously, efficiently and with greater reliability than is possible using prior art structures heretofore known and available for this purpose.

Other objects and advantages of the present invention will become more readily apparent from the following detailed description of a preferred embodiment of the invention showing the best mode for carrying out the invention when taken with the appended drawing in which the sole figure thereof illustrates in perspective the novel header structure of the invention.

Referring now to the drawing, there is shown the header structure of the present invention. The header comprises a metallic cup 10 having a cylindrical shell portion 12, a top wall or device support portion 14 closing one end of shell portion 12 and a flange portion 16. A pair of wires 18 and 20 project through apertures 22 and 24, respectively, defined in the top wall 14. The shell portion 12 is filled with fused glass 40 which forms a glass-to-metal seal with the header and wires 18 and 20 and also electrically isolates wires 18 and 20 from the header.

A third aperture 26 is defined in the top wall 14 by punching out a rectangular portion on three sides and bending the punched out portion to a vertical position normal to the plane of the top wall 14. Also a corner of the rectangular portion is cut out to leave remaining a horizontal member 28, elevated and spaced above the surface of top wall 14 and connected to it by a vertical member 30. A third wire 32 projects through the rectangular aperture 26 adjacent the horizontal member 28. As with the other wires, the glass 40 forms a seal with wire 32 and also isolates same from the header. The terminal portion 34 of wire 32 is welded to horizontal member 28. Since the horizontal member 28 is elevated above the surface of the header there is no possibility of glass flowing into the space defined between the terminal portion of wire 32 and horizontal member 28.

Although the invention has been shown and described in terms of a specific preferred embodiment, nevertheless it will be evident that changes and modifications are possible which do not in fact depart from the inventive concepts herein taugth. Such changes and modifications which evidence themselves to one skilled in this art from a knowledge of the teachings of the present invention are deemed to come within the purview hereof.

What is claimed is:

1. A header for mounting a semiconductor device, comprising a metallic cup having an annular shell and a top wall closing one end of said shell, said top wall having an aperture defined therein by a cutout and bent-up portion of said shell from the plane of said wall, said portion consisting of a part vertical to said wall and a part horizontal to said wall and separated from the latter by said vertical part, a wire projecting through said aperture, spaced apart from said vertical part and having one end thereof terminating adjacent said horizontal part and bonded thereto, and glass filling said cup and being fused to said shell, top wall and wire.

2. A header for mounting a semiconductor device, comprising a metallic cup having an annular shell and a top wall closing one end of said shell, said top wall having an aperture therein formed by cutting-out and bending-up a portion of said top wall, a horizontal member spaced above the plane of said top wall along one side of said aperture and a vertical member connected to one end of said horizontal member connecting said horizontal member to said top wall adjacent said aperture, said horizontal and vertical members comprising said bent up portion of said top wall, a wire projecting through said aperture, spaced apart from said vertical member and bonded to said horizontal member, and glass filling said cup and fused to said shell, top wall and wire.

References Cited in the file of this patent

UNITED STATES PATENTS

| | | |
|---|---|---|
| 2,200,332 | Henning | May 14, 1940 |
| 2,963,632 | Kilian et al. | Dec. 6, 1960 |
| 2,969,487 | Bourassa | Jan. 24, 1961 |